United States Patent [19]

Lesaicherre et al.

[11] 4,103,045
[45] * Jul. 25, 1978

[54] PROCESS FOR IMPROVING THE ADHESION OF COATINGS MADE OF PHOTORESISTANT POLYMERS TO SURFACES OF INORGANIC OXIDES

[75] Inventors: André Lesaicherre, Lesigny; Louis Linguenheld, St. Genis Laval, both of France

[73] Assignee: Rhone-Poulenc, S.A., Paris, France

[ * ] Notice: The portion of the term of this patent subsequent to Oct. 7, 1992, has been disclaimed.

[21] Appl. No.: 555,889

[22] Filed: Mar. 6, 1975

Related U.S. Application Data

[62] Division of Ser. No. 383,507, Jul. 30, 1973, Pat. No. 3,911,169.

[30] Foreign Application Priority Data

Jul. 31, 1972 [FR] France .................. 72.27581
May 7, 1973 [FR] France .................. 73.16286

[51] Int. Cl.$^2$ .................. B05D 5/10; B05D 5/12
[52] U.S. Cl. .................. 427/82; 427/93; 427/96; 427/240; 427/271; 427/299; 427/302; 427/407 R; 428/428; 428/429; 428/446; 428/447; 428/539; 96/35.1; 96/36.2
[58] Field of Search .................. 427/82, 407, 96, 93, 427/240, 299, 301, 271, 302; 96/35.1, 36.2; 428/428, 429, 446, 447, 535

[56] References Cited

U.S. PATENT DOCUMENTS

| | | | |
|---|---|---|---|
| 3,043,798 | 7/1962 | Boyer et al. | 428/429 |
| 3,228,895 | 1/1966 | Burks, Jr. et al. | 428/447 |
| 3,519,516 | 7/1970 | Zhinkin et al. | 428/447 |
| 3,549,368 | 12/1970 | Collins et al. | 96/36.2 |
| 3,561,996 | 2/1971 | Young | 427/407 |
| 3,663,277 | 5/1972 | Koepp et al. | 427/204 |
| 3,758,306 | 9/1973 | Roos | 96/36.2 |
| 3,911,169 | 10/1975 | Lesaicherre et al. | 427/96 |

Primary Examiner—Michael F. Esposito
Attorney, Agent, or Firm—Stevens, Davis, Miller & Mosher

[57] ABSTRACT

The adhesion between inorganic oxides and photoresistant polymers is improved by, prior to contacting the oxide and the polymer, treating the oxide with (a) an aminosilane of the formulae $R_3SiNHR'$ and $R_2Si(NHR')_2$; or a polysilazane, with the exception of hexaalkyldisilazanes, having 0.8 to 3 organic groups per silicon atom, and having units of the formulae $R_3Si(NH)_{0.5}$, $R_2SiNH$, $RSi(NH)_{1.5}$ or $Si(NH)_2$, in which formulae each R, which may be identical or different, represents hydrogen or an alkyl radical of 1 to 8 carbon atoms, an alkenyl radical of 2 to 4 carbon atoms, a cycloalkyl radical of 5 to 6 carbon atoms in the ring, an aryl radical of 6 to 8 carbon atoms, a benzyl radical, an alkoxy radical of 1 to 6 carbon atoms or an aryloxy radical of 6 to 8 carbon atoms; each R' represents hydrogen or an alkyl radical of 1 to 4 carbon atoms; or (b) a cyclopolysiloxazane of the general formulae:

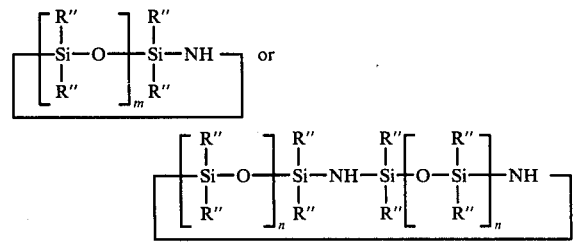

in which formulae each R", which may be identical or different, represents a methyl or phenyl radical, at least 40% of these radicals being methyl radicals; $m$ represents an integer of 2 to 5 and the symbols $n$, which are identical, each is 1 or 2.

5 Claims, No Drawings

PROCESS FOR IMPROVING THE ADHESION OF COATINGS MADE OF PHOTORESISTANT POLYMERS TO SURFACES OF INORGANIC OXIDES

This is a division, of application Ser. No. 383,507, filed July 30, 1973 now U.S. Pat. No. 3,911,169.

The present invention relates to a process for improving the adhesion of coatings made of photo-resistant polymers to surfaces of inorganic oxides by using, as anchoring agents, aminosilanes or polysilazanes [with the exception of hexaalkyldisilazanes] or cyclosiloxazanes.

It is well known to use hexaalkyldisilazanes and disilylamides to increase the adhesion of photo-resistant compounds to oxide surfaces so as to produce, after selective cleaning of the zones which are not protected by these photo-resistant compounds, miniaturised configurations which can be used in particular for semi-conductors (see French Patent Applications Nos. 2,012,133 and 2,028,331).

However, when these oxide layers, for example deposited on silicon tablets, are several weeks old or are produced by a wet method or at a low temperature, or are doped with phosphorus or boron, it is difficult to achieve good adhesion; consequently, during subsequent cleaning, detachment occurs to a greater or lesser extent due to the photo-resistant coatings becoming wavy, and subsequent lateral attack of the reserved parts of the oxides takes place. This undermining leads to a loss of definition and undesirable variations in the electrical properties of the electronic devices whilst greatly reducing the degree of integration which can be achieved on a given surface.

The present invention provides a process for improving the adhesion between a coating of a photo-resistant polymer and a layer of inorganic oxides, wherein prior to the deposition of the polymer coating on the oxide layer, the layer is treated with an organosilicon compound having silicon-nitrogen bonds which is:

(a) an aminosilane of the formulae $R_3SiNHR'$ and $R_2Si(NHR')_2$; or a polysilazane, with the exception of hexaalkyldisilazane, having 0.8 to 3 organic groups per silicon atom, and having units of the formulae $R_3Si(NH)_{0.5}$, $R_2SiNH$, $RSi(NH)_{1.5}$ or $Si(NH)_2$, in which formulae each R, which may be identical or different, represents hydrogen or an alkyl radial of 1 to 8 carbon atoms, an alkenyl radical of 2 to 4 carbon atoms, a cycloalkyl radical of 5 to 6 carbon atoms in the ring, an aryl radical of 6 to 8 carbon atoms, a benzyl radical, an alkoxy radical of 1 to 6 carbon atoms or an aryloxy radical of 6 to 8 carbon atoms; each R' represents hydrogen or an alkyl radical of 1 to 4 carbon atoms; or (b) a cyclopolysiloxazane of the general formulae:

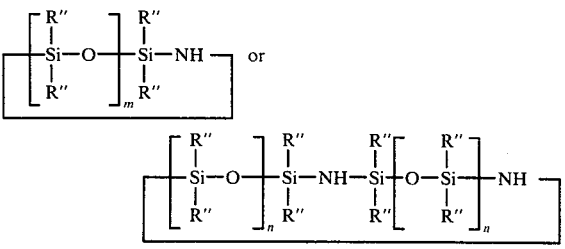

in which formulae each R'', which may be identical or different, represents a methyl or phenyl radical, at least 40% of these radicals being methyl radicals; m represents an integer of 2 to 5 and the symbols n, which are identical, each is 1 or 2.

Examples of radicals which R may represent include alkyl radicals such as methyl, ethyl, propyl, butyl, pentyl, hexyl, heptyl or octyl radicals; alkenyl radicals such as vinyl, allyl or butenyl radicals; cycloalkyl radicals such as cyclopentyl or cyclohexyl radicals; aryl radicals such as phenyl, tolyl or xylyl radicals; alkoxy radicals such as methoxy, ethoxy, propoxy, butoxy, pentoxy or hexyloxy radicals; and aryloxy radicals such as phenyloxy, tolyloxy or xylyloxy radicals. R' may be, for example, a methyl, ethyl, propyl, isopropyl or butyl radical.

The aminosilanes of the formula $R_3SiNHR'$ and $R_2Si(NHR')_2$ can be prepared by reacting ammonia or a primary amine with the corresponding organochlorosilanes, preferably in an organic solvent medium such as toluene, xylene, carbon tetrachloride or diethyl ether. However, during the reaction with ammonia, it is advisable to choose, as starting organochlorosilanes, those in which the radicals R contain at least three carbon atoms [Fr. Metras and J. Valade, Bull. Soc. Chim. Fr., 5, page 1423/7 (1965) and 7, pages 2155/61 (1966)], or one oxygen atom and at least two carbon atoms [U. Wannagat et al., Monatsh. Chem., 96, 585–592 (1965)]. On the other hand, during the reaction with a primary amine, the conventional organochlorosilanes can be used [Gmelins Handbuch der anorganischen Chemie, part C, pages 310/13 (1958)].

Aminosilanes which can be used in the invention include:

$(C_2H_5O)_3SiNH_2$, $(C_2H_5O)_2CH_3SiNH_2$, (iso-$C_3H_7O)_2C_6H_5SiNH_2$, $(C_2H_5)_3SiNH_2$, (iso-$C_3H_7)_2HSiNH_2$, (iso-$C_3H_7)_2Si(NH_2)_2$ and $(CH_3)_2Si(NHCH_3)_2$.

The polysilazanes which can be used in the invention are well known and are easy to prepare. They may be:

1. A linear polymer corresponding to the formulae: $H_2N(R_2SiNH)_pSiR_2NH_2$ (formula Q) and $R_3SiNH(R_2SiNH)_pSiR_3$ (formula Q') in which p is a number from 1 to 15 and p' represents zero or a number from 1 to 15, at least one of the symbols R representing an alkoxy or aryloxy radical when p' is zero. Those of the formula (Q) can be prepared by bringing a diorganodichlorosilane into contact with ammonia, preferably in the presence of a tertiary amine, and those of the formula (Q') by reacting ammonia with a triorganochlorosilane or a mixture of diorganodichlorosilanes and triorganochlorosilanes [see French Patent Specification No. 1,086,932; Report N. 64/29,549 U.S. Department of Commerce, R. E. Burks and Th. W. Ray-Southern Research Institute (1964) page 20; and W. E. Weibrecht and E. G. Rochow, J. Organometal. Chem., 5, pages 520-525 (1966)].

Other processes can also be used, for example, cleavage of a cyclopolysilazane by means of an alkanol or phenol (or its derivatives); in this case, the polymers carry at least one alkoxy or aryloxy group at the chain-end and can have the formula $H_2N(R_2SiNH)_pSiR_3$ [U. Wannagat et al., Monatsh. Chem., 95, pages 801-811 (1964) and K. A. Andrianov et. al., Izv. Akad. USSR, 3, 446-449 (1965)].

2. A cyclic polymer of formula $(R_2SiNH)_n$ is which n is 3 or 4; they are obtained by simply reacting ammonia with a diorganodichlorosilane [see British Patent Specification No. 881,178; D. W. Fink, Angew. Chem., 78, 803-19 (1966); and D. Ya Zhinkine, N. V. Markova and M. V. Sobolevski, ZH Obchtch Khim. USSR, 32, pages 2652-54 (1962)].

3. A resinous polymer having units of the formula $R_3Si(NH)_{0.5}$, $R_2SiNH$, $RSi(NH)_{1.5}$ or $Si(NH)_2$ and having 0.8 to 1.99 organic groups per silicon atoms. These polymers are advantageously prepared by bringing the corresponding organochlorosilane, or mixtures of these silanes, into contact with ammonia, preferably in an organic solvent medium in order to avoid premature gelling (see French Patent Specification Nos. 1,379,243, 1,392,853 and 1,393,728). These polymers are quite often rather ill-defined products which contain, in preponderant amount, Si-NH-Si bonds and, in lesser amount, $SiNH_2$ bonds and which sometimes contain, in addition to crosslinked polymers, linear and cyclic polymers, it only being possible for the latter to form if diorganodichlorosilanes are present amongst the starting organochlorosilanes.

It is easy to produce resinous polymers carrying any organic groups such as alkoxy or aryloxy, by working in accordance with the process which has just been described; however, Si-alkoxy or Si-aryloxy bonds can also be produced by simply bringing resinous polymers which do not contain such bonds into contact with an alkanol or a phenol of a derivative of the latter, because of the ease with which the -SiNH bond breaks in the presence of an organic compound possessing an OH group.

Examples of particularly effective cyclosiloxazanes which can be used in this invention include:

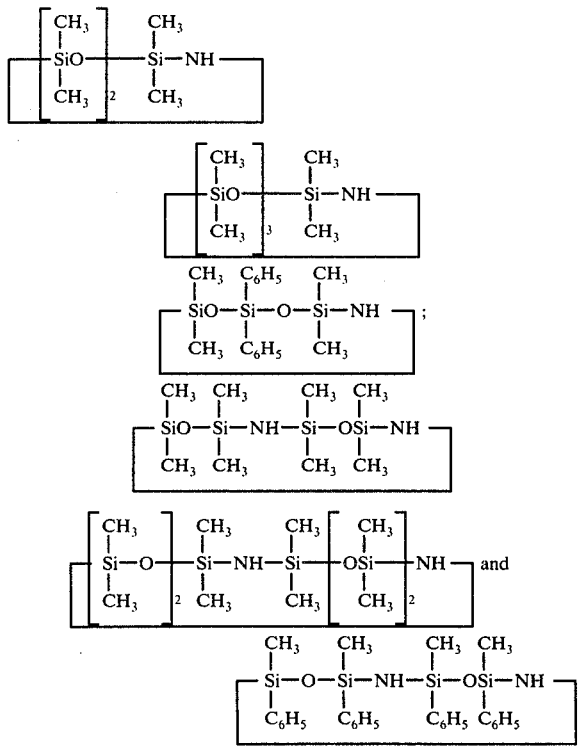

To prepare these cyclosiloxazanes, α,ω-dichlorodiorganopolysiloxanes of formula

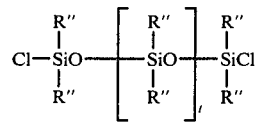

[in which the symbol t represents zero or an integer of 1 to 4] are generally treated with ammonia, preferably in a diluent medium.

The α,ω-dichlorodisiloxanes (t=0) lead only to cyclosiloxazanes which contain two Si-NH-Si bonds, the α,ω-dichlorotrisiloxanes (t=1) lead to both types of cyclosiloxazanes and the α,ω-dichloropolysiloxanes (t>2) lead to cyclosiloxazanes which contain only one Si-NH-Si bond. The preparation of these cyclosiloxazanes is described in French Patent Specification Nos. 1,356,767 and 1,357,957 and in the articles by C. R. Kruger and E. G. Rochow [Angew. Chem. 74, 491 to 492 (1962)] and J. G. Murray and R. K. Griffith [J. Organ. Chem. 29, 1215 to 1217 (1964)].

Reference is directed to the various above mentioned publications for details of how to prepare to organosilicon compounds to be used in this invention.

In order to treat the layer of inorganic oxide, the aminosilanes, polysilazanes or cyclosiloxazanes can be used in the pure state or can be diluted in a suitable solvent such as trifluorotrichloroethane or trichloroethylene; an alkanol such as ethanol can even be used subject to the condition that it does not contain any water and that the mixing is carried out at ambient temperature. The use of solvents is advisable when the aminosilanes, polysilazanes or cyclosiloxazanes have melting points above 25° C.

Alternatively they can be introduced into formulations for aerosols which contain, among other constituents, propellant fluids such as nitrous oxide and chlorofluoromethanes. Various techniques are suitable for coating the layer of inorganic oxide, for example, immersion or spraying, but centrifuging of the aminosilane, polysilazane or cyclosiloxazane (which have been deposited beforehand in the form of drops) is generally used, and enables a uniform layer a few tens of angstroms thick e.g. 20-50 Å to be obtained. It is possible to avoid treating the oxide layers directly by adding the aminosilane, polysilazane or cyclosiloxazane to solutions of the photoresistant resin, but it is preferable to avoid this process because interactions between the aminosilane, polysilazane or cyclosiloxazane on the one hand and the resin on the other hand are not impossible.

The solution of photoresistant resin is then deposited homogeneously on the treated adhesion primer, preferably working in accordance with the usual processes, that is to say, by centrifuging. The resin can contain photo-sensitisers which decompose under the effect of photons to give free radicals. They can be of the negative type, in which case they crosslink on exposure to light and become insoluble in liquid developers, or they can be of the positive type in which case there is depolymerisation of the zones exposed to light. Details of the nature of these photoresistant resins, which are now available commercially on a large scale, are given in particular in French Patent Application No. 2,028,331 and in two articles by K. G. Clark which appeared in the journal Solid State Technology, June 1971 issue, pages 52 to 56, and September 1971 issue, pages 48 to 53 and reference is directed to these publications for these details.

After the coating on the resin, the thickness of which coating generally varies from 3,000 to 15,000 angstroms, has been produced, it is exposed to light rays through a screen for the purpose of crosslinking or depolymerising certain regions in accordance with the desired configurations which can be used, for example, for semi-conductor devices or integrated circuits.

The non-polymerised or depolymerised regions of the coating are then removed by a suitable solvent or suitable developing solution; at this stage of the treatment, reheating is not necessary to improve the adhesion of the resins, because the process of the invention provides anchoring easily without heating; however, heating can be carried out in some very difficult cases, solely to evaluate the compatibility between the resins and the anchoring agents.

Finally, the surface of the material is treated with a cleaning solution which usually consists of an aqueous solution of ammonium fluoride and hydrofluoric acid. The contact time is generally a few minutes.

It is possible to carry out various specific operations used in the electronics industry across the openings thus produced. For example, diffusion of suitably chosen impurities (phosphorus, arsenic, antimony, boron, aluminum, gallium or indium) can be carried out in the vapour phase, in order to form P-type and N-type junctions; it is also possible to produce metallic contacts of gold, silver and other conducting metals. The layers of inorganic oxides which can be used according to the process of the invention can consist of oxides of silicon, aluminum, copper, beryllium, titanium, zinc, nickel or cobalt.

The improvement of the adhesion of the photoresistant resins to these oxide layers can be applied not only to the manufacture of semi-conductors (PLANAR transistors and MOS and MOSFET dipolar integrated circuits) but also to that of photo-screens in general, and of printed circuits.

The following examples illustrate the invention:

All the operations are carried out under a dustfree hood, the temperature of which is adjusted to 20° C and the relative humidity to 20%, and all the silicon tablets used are 0.2 mm thick and 30 mm in diameter.

EXAMPLE I

Silicon tablets which have been oxidised for several weeks are immersed for 15 seconds in an aqueous solution of ammonium fluoride and are then rinsed with acetone. After drying, they are divided into three equal batches, A, B and C.

By means of a syringe equipped with a 0.5 micron membrane filter, one drop of hexamethyldisilazane is deposited on each tablet B and one drop of hexamethylcyclotrisilazane is deposited on each tablet C. The tablets B and C are then centrifuged at 5,000 revolutions per minute for 15 seconds.

A solution, of viscosity 35 cPo at 25° C, containing 19.5% by weight of a positive resin is then applied to the surface of the tablets B and C, which has just been coated and furthermore, to the surface of the tablets A which has simply been cleaned; the resin is a phenol/formaldehyde resin etherified by carboxymethyl groups and it contains a photo-sensitiser of the diazo-ortho-quinone type.

These tablets are then centrifuged at 5,000 revolutions per minute for 30 seconds, which makes it possible to obtain a layer of thickness 7,000 angstroms, and they are then heated with infra-red rays at about 80° C for 30 minutes under a nitrogen atomsphere. The purpose of this heating is to remove the solvents.

The photo-sensitive coating thus produced is finally exposed selectively, by interposition of a screen, to ultra-violet rays for 14 seconds. By this means, the illuminated parts are depolymerised in accordance with a configuration for semi-conductors, which comprises units formed from parallel bands of width 3 microns, separated by a space of 3 microns. The coating is then placed in contact, for 50 seconds, with a conventional developer based on an aqueous alkaline solution, in order to remove the depolymerised parts, and is then rinsed with demineralised water.

At this stage of the treatment, the three batches of tablets are checked and it is found that only batch C is correct; the coating of protective resin is completely detached on tablets A and B.

The photogravure process is completed by subjecting the tablets C directly, without reheating the coating, to a cleaning solution for 6 minutes 25 seconds so as to remove the layer of silica which was not protected by the resin. This solution consists of 7 parts by volume of a saturated aqueous solution of ammonium fluoride and one part by volume of a 48% strength by weight aqueous solution of hydrofluoric acid.

After drying, it is found that the coating continues to adhere firmly to the substrate and that it does not show any tendency to form waves or to lift. As a result of this, no lateral attacks along the reserved parts are observed.

EXAMPLE II

Silicon tablets coated with a layer of silica of thickness 5,000 angstroms (formed by thermal oxidation in a moist medium) doped with boron at a concentration of $1.5 \times 10^{20}$ atoms of boron per $cm^3$, are used.

These tablets are then divided into three batches $A_1$, $B_1$ and $C_1$.

One drop of hexamethyldisilazane is deposited, in the manner indicated in Example I, on each tablet $B_1$, and one drop of a 50% strength by weight solution of octamethylcyclotetrasilazane in trifluorotrichloroethane is deposited on each tablet $C_1$.

The tablets $B_1$ and $C_1$ are centrifuged at 5,000 revolutions per minute for 15 seconds and then the positive resin used in Example I is applied to the treated surface of these tablets as well as to the surface of the tablets $A_1$ which remained as it was.

The dispersion of the resin, its drying, its exposure to light and its developing are carried out thereafter in accordance with the procedure of Example I. However, the time of contact for the development with the developer is 60 seconds in the case of the tablets $B_1$ and $C_1$ and remains 50 seconds in the case of the tablets $A_1$.

A check carried out on these tablets after this sequence of operations shows that only the resin coating deposited on the tablets $C_1$ is suitable; it is almost completely detached on the tablets $A_1$ and $B_1$.

The photogravure process of the tablets $C_1$ is completed by subjecting them for 6 minutes 25 seconds to the cleaning solution of Example I. After drying, it is found that the resin coating adheres perfectly even when it comprises zones cut up into fine strips of width 3 microns, also spaced 3 microns apart. Moreover, the absence of cleaning of the silica layer at the periphery of the reserved parts is noted.

EXAMPLE III

Silicon tablets are coated with a layer of silica of thickness 5,000 angstroms by thermal oxidation in a moist medium.

This oxide layer is then doped with phosphorus at a concentration of $7 \times 10^{20}$ atoms of phosphorus per $cm^3$.

These tablets are then divided into three batches $A_2$, $B_2$ and $C_2$. One drop of bis-(trimethylsilyl)-acetamide is deposited, in the manner indicated in Example I, on each tablet $B_2$, and one drop of a 50% strength by weight solution of trimethyltriphenylcyclotrisilazane in trifluorotrichloroethane is deposited on each tablet $C_2$. The tablets $B_2$ and $C_2$ are centrifuged at 5,000 revolutions per minute for 15 seconds and then the positive resin used in Example I is applied to their treated surface as well as to the surface of the tablets $A_2$ which has remained as it was.

The dispersion of the resin, its drying and its insulation are carried out as described in Example I. The developing is then carried out by bringing the tablets into contact with the developer of Example I, for 60 seconds in the case of the tablets $B_2$ and $C_2$ and 40 seconds in the case of the tablets $A_2$.

A check made on these tablets, at this stage of the treatment, shows that the coating of the insoluble resin deposited on the tablets $A_2$ is completely detached, that deposited on the tablets $B_2$ shows slight detachment in places, and only that deposited on the tablets $C_2$ adheres correctly.

The final photogravure treatment is carried out on the tablets $B_2$ and $C_2$ by immersing them for 6 minutes 25 seconds in the cleaning mixture described in Example I. The tablets are dried and it is found that the tablets $B_2$ show considerable lateral attack ranging up to a few microns on the edges of the reserved oxide layer. In the case of the tablets $C_2$, this lateral attack is barely perceptible.

EXAMPLE IV

Silicon tablets are coated with a layer of silica of thickness 3,000 angstroms by thermal oxidation in a moist medium.

These incompletely dried tablets are divided into three batches $A_3$, $B_3$ and $C_3$. One drop of hexamethyldisilazane is deposited, in the manner indicated in Example I, on each tablet $B_3$ and one drop of a 50% strength by weight solution, in trifluorotrichloroethane, of the mixture of polysilazanes prepared as described in Example I of French Patent Specification No. 1,210,810 is deposited on each tablet $C_3$.

The tablets $B_3$ and $C_3$ are centrifuged at 5,000 revolutions per minute for 15 seconds and then the positive resin used in Example I is applied to their surface which has just been treated as well as to the surface of the tablets $A_3$ which has simply been cleaned.

The dispersion of the resin, its drying and its insulation are carried out thereafter in accordance with the procedure of Example I. It is then developed by contact with the developer of Example I for 60 seconds in the case of the tablets $A_3$ and 30 seconds in the case of the tablets $B_3$ and $C_3$.

A check made on these tablets at this stage of the photogravure treatment shows that the coating of insoluble resin deposited on the tablets $A_3$ and $B_3$ is almost completely detached. Only that deposited on the tablets $C_3$ is suitable. The latter are heated for 20 minutes at 105° C in order to check that the resin is anchored permanently to the substrate, and no detachment is observed: the compatibility between the resin and the polysilazane layer is thus excellent.

These tablets $C_3$ are finally immersed for 6 minutes 25 seconds in the cleaning bath of Example I and it is found, after drying, that the resin coating is still correctly anchored and that, because of this, no lateral attacks of the reserved parts have taken place.

EXAMPLE V

One drop of a mixture of hexamethylcyclotrisilazane and of the linear polysilazane of the formula $(CH_3)_3SiNHSi(CH_3)_2NHSi(CH_3)_3$ (fraction containing 33% of the mixture prepared in Example 6 of French Patent Specification No. 1,086,932) is deposited on silicon tablets which have been oxidised at the surface for several weeks.

These tablets are centrifuged at 5,000 revolutions per minute for 15 seconds and then a filtered solution, of viscosity 30 cPo at 25° C, containing 9% by weight of a negative resin of average molecular weight 200,000, is applied to their surface, the resin having been obtained by esterification of a polyvinyl alcohol with cinnamic acid or a derivative of the latter.

These tablets are then centrifuged at 3,000 revolutions per minute for 30 seconds, and this results in the deposition of a film of resin of thickness about 9,000 angstroms. The film deposited is dried by heating the tablets with infra-red rays for 30 minutes at 80° C in an inert gas atmosphere, and is then exposed selectively, through a screen, to ultra-violet rays for 5 seconds. It is then developed by immersing the tablets in trichloroethylene for 30 seconds and is rinsed in a 50/50 by volume mixture of trichloroethylene and isopropyl alcohol.

A check made at this stage of the photogravure treatment shows that the adhesion of the layer of resin is correct. In order to complete the photogravure treatment, the tablets are finally immersed in the cleaning bath of Example I for 6 minutes 25 seconds. After drying, neither detachment of the resin in waves nor, consequently, lateral attacks of the reserved parts are observed.

EXAMPLE VI (a) 493 g (2.43 mols) of 1,3-dichloro-tetramethyl-disiloxane and 500 $cm^3$ of anhydrous cyclohexane are introduced into a suitable container. Ammonia is bubbled through this solution for 3 hours, at the rate of 48 g/hour. After bubbling for 2 hours, the temperature of the solution reaches 80° C and falls back to 60° C after one hour. The contents of the flask are allowed to cool to about 25° C and one liter of water is added in order to dissolve the ammonium chloride formed. The aqueous layer is removed and the cyclohexane of the organic layer is distilled under a pressure less than atmospheric pressure; at the end of the distillation, the temperature of the residual product is 105° C and the pressure is 20 mm of mercury. The residual product is rectified and 184 g of a polysiloxazane, which boils at about 95° C under 15 mm of mercury, melts at 40° C and corresponds to the formula:

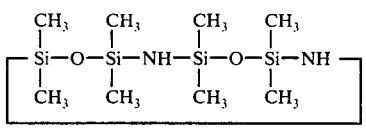

are collected.

(b) The procedure of Example I is repeated except that the hexamethylcyclotrisilazane is replaced by the cyclosiloxazane prepared according to (a). It is deposited on each tablet C in the form of a 50% strength by weight solution in ethanol. It is found that the coating of photoresistant resin possesses the same properties of adhesion as the coating attached by means of hexamethylcyclotrisilazane, and that this applies at all the stages of the treatment.

EXAMPLE VII 75 g (0.5 mol) of methyltrichlorosilane, 581 g (4.5 mols) of dimethyldichlorosilane, 163 g (1.5 mols) of trimethylchlorosilane and 1,500 cm$^3$ of anhydrous cyclohexane are introduced into a suitable container. A stream of ammonia is then bubbled through this solution for 5 hours at the rate of 63 g/hour. After bubbling for 2 hours, the temperature of the solution reaches 77° C, remains at this value for 2 further hours and falls back to 60° C over the course of 1 hour. The ammonium chloride which has formed is filtered off and washed with 1,000 cm$^3$ of cyclohexane, and then all the cyclohexane (solvent and washing agent) is removed by distillation under a pressure less than atmospheric pressure; at the end of the distillation, the temperature of the residual product is 100° C and the pressure is 20 mm of mercury. 334 g of an oily polysilazane consisting of units of the formulae $CH_3Si(NH)_{1.5}$, $(CH_3)_2SiNH$ and $(CH_3)_3Si(NH)_{0.5}$, are collected.

When the procedure of Example I is repeated but replacing the hexamethylcyclotrisilazane by the same weight of this oily polysilazane, coatings which adhere very well to the substrate are obtained.

EXAMPLE VIII 292 g (1 mol) of octamethylcyclotetrasilazane are introduced into a suitable container and this product is heated to 92° C in order to liquefy it; 92 g (2 mols) of absolute alcohol are then added over a period of 10 minutes. The evolution of ammonia takes place from the start of the addition of the alcohol. The reaction is completed by heating the contents of the container at about 150° C for 24 hours. On rectification, 118 g of a polysilazane which boils at about 76° C under 15 mm of mercury and which corresponds to the formula $C_2H_5O[(CH_3)_2SiNH]_3Si(CH_3)_2OC_2H_5$ are collected. When the procedure of Example I is repeated replacing the hexamethylcyclotrisilazane by the same weight of the above mentioned polysilazane, coatings which adhere very well to the substrate are obtained.

EXAMPLE IX 516 g (4 mols) of dimethyldichlorosilane, 217 g (2 mols) of trimethylchlorosilane and 1,500 cm$^3$ of anhydrous cyclohexane are introduced into a suitable container. Ammonia is bubbled through this solution for 5 hours at the rate of 50 g/hour. After bubbling for 1 hour 30 minutes, the temperature of the solution reaches 74° C; it stays at this level for 2 hours 30 minutes and falls back to 60° C at the end of one hour. The solution is then allowed to cool to about 25° C and 1,500 cm$^3$ of water are added to dissolve the ammonium chloride which has formed. The aqueous layer is removed and the cyclohexane of the organic layer is distilled under a pressure less than atmospheric pressure; at the end of the distillation, the temperature of the residual product is 120° C and the pressure is 15 mm of mercury. 375 g of an oily polysilazane consisting of units of the formulae $(CH_3)_2SiNH$ and $(CH_3)_3Si(NH)_{0.5}$ are collected. When the procedure of Example I is repeated replacing the hexamethylcyclotrisilazane by the same weight of the above mentioned oily polysilazane, coating which adhere very well to the substrate are obtained.

EXAMPLE X 300 g (2 mols) of methyltrichlorosilane, 775 g (6 mols) of dimethyldichlorosilane and 5,000 cm$^3$ of cyclohexane are introduced into a suitable container. Ammonia is bubbled for 8 hours at the rate of 62 g/hour through this solution which is kept at a temperature of 25° C by means of a waterbath placed beneath the container. 138 g (3 mols) of absolute ethanol are then added over the course of 30 minutes and the contents of the container are then heated gradually so as to reach a temperature of 80° C after one hour; the ammonia formed is evolved from the start of the heating. The mixture is allowed to cool, the ammonium chloride which has formed is filtered off and washed with 1,000 cm$^3$ of cyclohexane and all the cyclohexane (diluent and washing agent) is distilled under a pressure less than atmospheric pressure; at the end of the distillation, the temperature of the residual product is 110° C and the pressure is 18 mm of mercury. 515 g of an oily polysilazane, of viscosity 12 cPo at 25° C, which simultaneously contains Si-NH-Si and SiOC$_2$H$_5$ bonds detected by analysis by means of an infra-red spectrophotometer, are collected. When the procedure of Example I is repeated replacing the hexamethylcyclotrisilazane by the same weight of the above mentioned oily polysilazane, coatings which adhere very well to the substrate are obtained.

We claim:

1. A process for bonding a photoresistant polymer to a layer of inorganic oxides, wherein prior to the deposition of the polymer on the oxide layer, the layer is treated with an organosilicon compound having silicon-nitrogen bonds which is a polysilazane of the formula $R_3SiNH(R_2SiNH)p'SiR_3$ in which $p'$ is zero or a number from 1 to 15, and each R group may independently represent methyl, phenyl, or ethoxy, at least one of the symbols R representing a methoxy group when $p'$ is zero.

2. The process of claim 1 wherein the organosilicon compound is deposited on the inorganic oxide layer by applying a solution of the compound to the layer and then centrifuging to give a uniform coating of compound about 20 to 50Å thick on the layer.

3. The process of claim 1 wherein the photoresistant polymer is of the negative type.

4. The process of claim 1 wherein the photoresistant polymer is of the positive type.

5. A method of preparing a semi-conductor or an integrated circuit of improved resolution which includes the step of applying a photoresistant polymer to an inorganic oxide layer treated by a process according to claim 1.

* * * * *